United States Patent
Chen et al.

(10) Patent No.: US 7,129,149 B1
(45) Date of Patent: Oct. 31, 2006

(54) METHOD FOR FORMING SHALLOW TRENCH ISOLATION STRUCTURE WITH ANTI-REFLECTIVE LINER

(75) Inventors: Chih-Hsiang Chen, Portland, OR (US); Yiming Gu, Hillsboro, OR (US); Guo-Qiang Lo, Portland, OR (US)

(73) Assignee: Integrated Device Technology, Inc., San Jose, CA (US)

( * ) Notice: Subject to any disclaimer, the term of this patent is extended or adjusted under 35 U.S.C. 154(b) by 141 days.

(21) Appl. No.: 10/862,520

(22) Filed: Jun. 7, 2004

(51) Int. Cl.
*H01L 21/76* (2006.01)
*H01L 21/336* (2006.01)

(52) U.S. Cl. .................... 438/424; 438/296; 438/294; 438/295; 438/435

(58) Field of Classification Search ........ 438/424–425, 438/430, 432, 296
See application file for complete search history.

(56) References Cited

U.S. PATENT DOCUMENTS

| | | |
|---|---|---|
| 4,563,227 A | 1/1986 | Sakai et al. |
| 4,663,832 A | 5/1987 | Jambotkar |
| 4,871,685 A | 10/1989 | Taka |
| 4,916,086 A | 4/1990 | Takahashi |
| 4,923,821 A | 5/1990 | Namose |
| 4,931,409 A | 6/1990 | Nakajima |
| 5,084,408 A | 1/1992 | Baba |
| 5,258,332 A | 11/1993 | Horioka |
| 5,350,941 A | 9/1994 | Madan |
| 5,433,794 A | 7/1995 | Fazan et al. |
| 5,521,422 A | 5/1996 | Mandelman |
| 5,567,270 A | 10/1996 | Liu |
| 5,578,518 A | 11/1996 | Koike et al. |
| 6,165,854 A * | 12/2000 | Wu ............................ 438/296 |
| 6,255,717 B1 | 7/2001 | Babcock et al. |
| 6,258,676 B1 * | 7/2001 | Lee et al. ................... 438/296 |
| 6,645,867 B1 | 11/2002 | Dokumaci et al. |
| 6,541,382 B1 | 4/2003 | Cheng et al. |
| 6,645,868 B1 | 11/2003 | Babcock et al. |
| 6,682,985 B1 * | 1/2004 | Yuzuriha et al. ............. 438/425 |
| 6,689,665 B1 | 2/2004 | Jang et al. |
| 6,709,976 B1 * | 3/2004 | Kamin et al. ................ 438/638 |
| 6,828,212 B1 * | 12/2004 | Barry et al. ................. 438/424 |
| 6,835,670 B1 * | 12/2004 | Ida .............................. 438/761 |

OTHER PUBLICATIONS

Planarization and Integration of Shallow Trench Isolation, Pan et al., 1999 VMIC, Santa Clara, CA, Jun. 1998.

* cited by examiner

*Primary Examiner*—Luan Thai
(74) *Attorney, Agent, or Firm*—Glass & Associates (57) ABSTRACT

The present invention relates to a shallow trench isolation structure and a method for forming a shallow trench isolation structure on a semiconductor substrate. A masking structure that includes a hard mask is formed over the semiconductor substrate, and an etch is performed so as to form trenches within the semiconductor substrate. An anti-reflective film is deposited such that it extends within the trench. A dielectric film is deposited over the anti-reflective film such that it fills the trench. A heating process step is then performed to anneal the substrate, rounding the corners of the trench. A chemical mechanical polishing process is performed to remove those portions of the anti-reflective film and the dielectric film that overlie the hard mask. The hard mask is then removed, producing a shallow trench isolation structure that prevents lifting and notching in subsequent fabrication steps.

10 Claims, 12 Drawing Sheets

METHOD FOR FORMING SHALLOW TRENCH ISOLATION STRUCTURE WITH ANTI-REFLECTIVE LINER

FIELD OF THE INVENTION

The present invention relates to the field of semiconductor devices. More specifically, the present invention relates to semiconductor device shallow trench isolation structures and methods for forming shallow trench isolation structures.

BACKGROUND ART

Shallow trench isolation structures are used in semiconductor device fabrication to isolate active areas of the semiconductor substrate. Typically, shallow trench isolation structures are formed by etching the top surface of the semiconductor substrate so as to form trenches that extend into the semiconductor substrate. These trenches surround areas of the semiconductor substrate that are commonly referred to as "active areas." A layer of oxide is then deposited to fill up the trenches, electrically isolating active areas from each other.

Conventional shallow trench isolation structures usually include trenches that have a flat horizontal bottom and that have vertical sidewalls. The sharply angled bottom corners of conventional shallow trench isolation structures result in thermal-mechanical stress buildup concentrated at the bottom corners. This corner stress buildup can result in localized stress-related defects. In severe cases, stresses from subsequent process steps and from thermal cycling can cause dislocation and cracking. This can cause device failure, resulting in reduced manufacturing yield and increased manufacturing costs.

Another problem that can arise with respect to conventional shallow trench isolation structures is electrical field buildup enhancement at top corners of the active area. The sharper the corner is, the greater enhancement of the field buildup will be. As a result, the corner portion of the transistor will have lower threshold voltage than the the main channel portion of the transistor. This phenomenon, commonly referred as "kink effect," can produce early turn-on of transistors and undesired cross-talk between adjacent devices.

One method for reducing stress buildup and kink effect is to form an oxide liner by performing an oxidation step prior to filling the trench. However, conventional processes for forming oxide trench liners use high temperature processes (often at temperatures of greater than 1,100 degrees centigrade), which stress the substrate, resulting in undesired stress buildup.

After the formation of conventional shallow trench isolation structures, implantation steps are performed so as to form various doped regions. During these subsequent implant steps, resist masks are exposed and developed to define the areas that are to be doped. However, when the resist thickness is not sufficient to block incoming light, some of the light passes through the resist and into the trenches. This light reflects off of the sidewalls of the trench so as to cause resist notching and lifting. Resist notching exposes areas of the active areas that are supposed to be covered by resist, causing undesired implantation. Lifting results in resist covering areas that were supposed to be exposed, preventing the implantation of desired impurities.

One method for preventing this problem is to increase the resist thickness during implant process steps. However, this can result in bridging and may not be practical when features less than 0.13 micron must be formed.

Accordingly there is a need for a shallow trench isolation structure and a method for forming a shallow trench isolation structure that reduces localized stress-related defects and "kink effect." Also, there is a need for a shallow trench isolation structure and a method for forming a shallow trench isolation structure that will reduce or eliminate notching and lifting in subsequently formed resist masks. The present invention meets the above needs.

DISCLOSURE OF THE INVENTION

A shallow trench isolation structure and a method for forming a shallow trench isolation structure are disclosed. First, a masking structure is formed over the semiconductor substrate that includes a hard mask. The masking structure is patterned to form openings that expose portions of the top surface of the semiconductor substrate. An etch is performed so as to form trenches that extend within the semiconductor substrate. A layer of anti-reflective film is deposited such that it overlies the bottom and side surfaces of the trench. The trench is then filled with dielectric film. A heating process is then performed to round the corners of the trench and densify both the anti-reflective film and the dielectric film. A chemical-mechanical polishing process is then performed, leaving a shallow trench isolation structure that includes an anti-reflective liner and a dielectric plug that extends within the anti-reflective liner.

The heating process for annealing the substrate is performed at a significantly lower temperature than conventional processes for forming oxide trench liners. Accordingly, less stress buildup results as compared to processes that use conventional oxide trench liners. In addition, the trench of the present invention has rounded corners, resulting in reduced stress build up and reduced "kink effect" as compared to prior art trenches having sharp corners. Moreover, the use of an antireflective liner eliminates notching and lifting problems that can result from reflection of light off of the sides of trenches. Accordingly, manufacturing yield is improved, resulting in reduced manufacturing cost.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
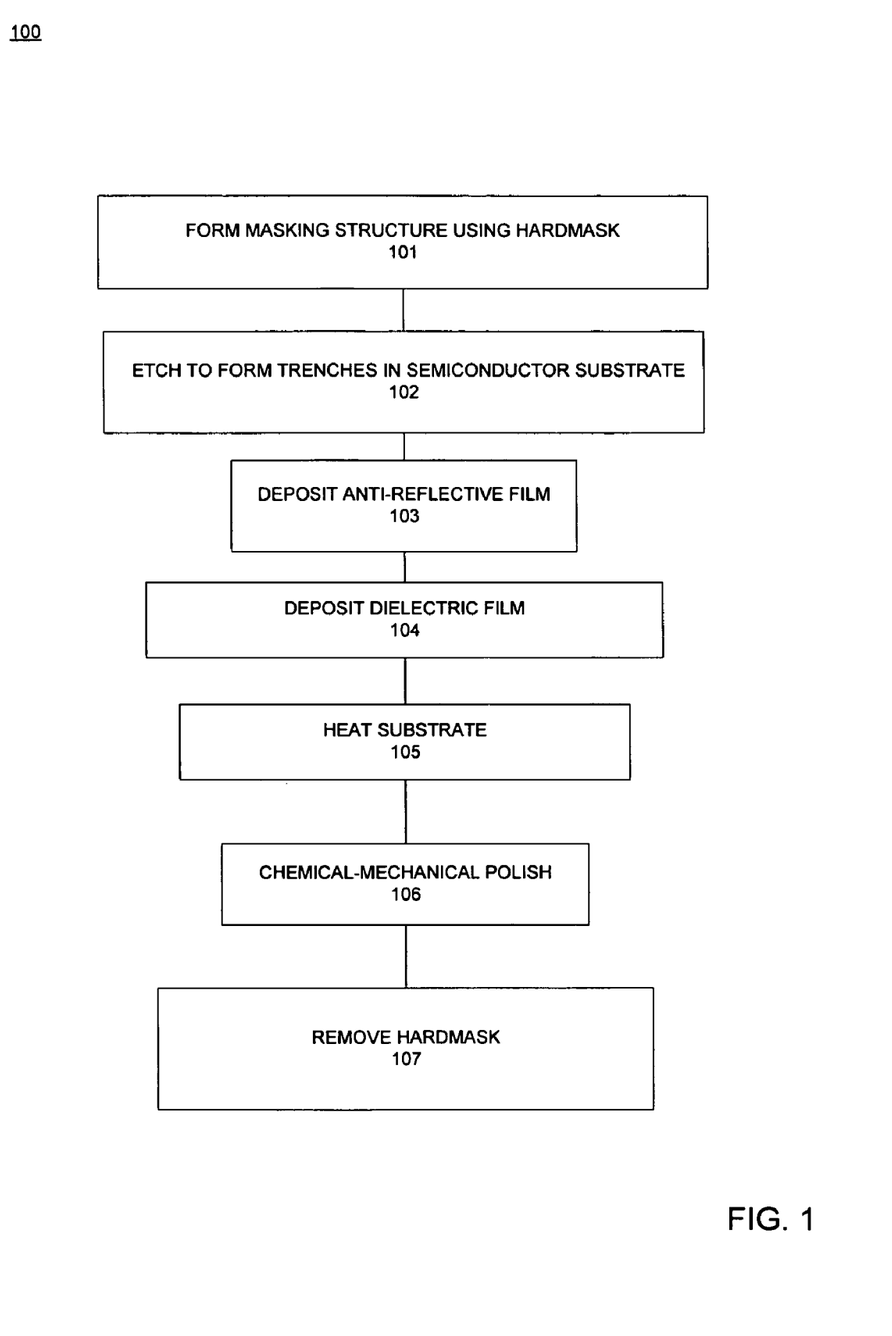
FIG. 1 is a flow chart that illustrates a method for forming a shallow trench isolation structure on a semiconductor substrate in accordance with one embodiment of the present invention.

FIG. 1 illustrates a method 100 for forming a shallow trench isolation structure on a semiconductor substrate. As shown by step 101 a masking structure is formed over a semiconductor substrate. In the present embodiment the masking structure includes a hard mask. Openings that extend through the hardmask define the location of shallow trenches.

Figure 2:
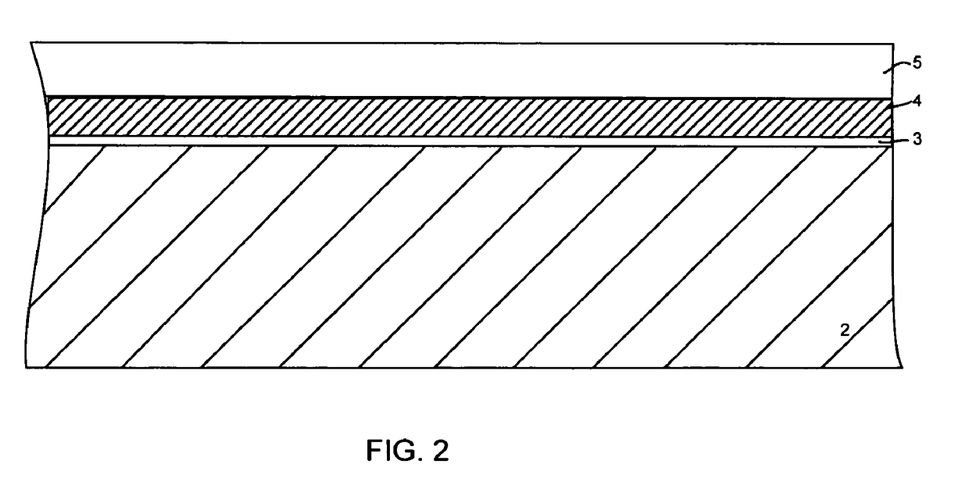
FIG. 2 is a side cross-sectional view of a portion of a semiconductor substrate over which an oxide layer, hard mask and a layer of photoresist have been deposited in accordance with one embodiment of the present invention.
Figure 3:
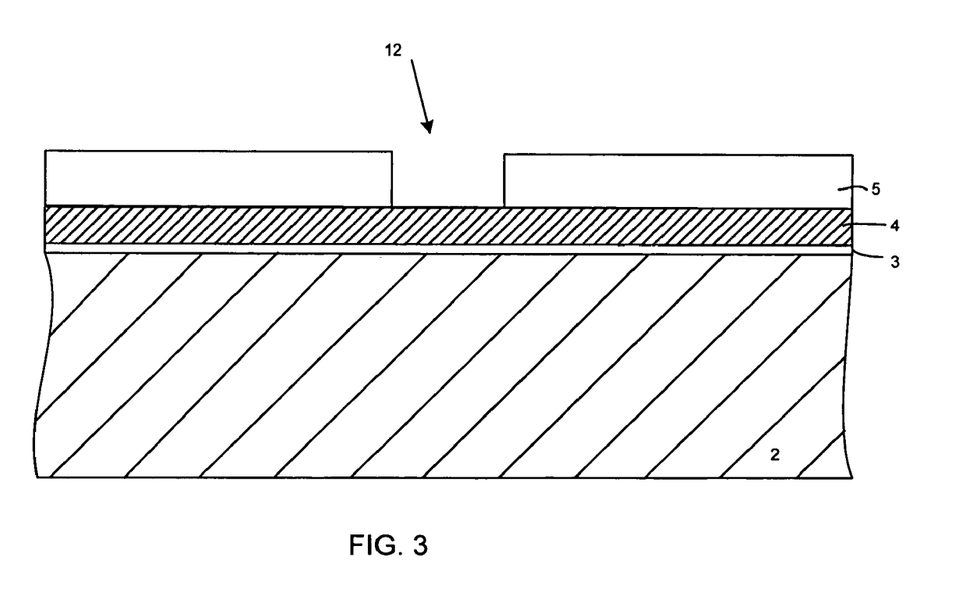
FIG. 3 is a side cross-sectional view of the structure of FIG. 2 after the layer of resist has been patterned and developed in accordance with one embodiment of the present invention.
Figure 4:
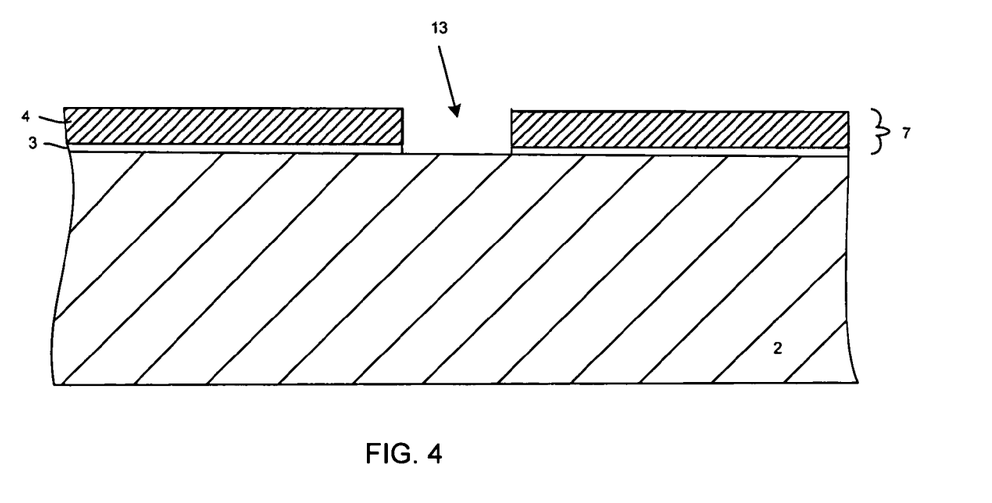
FIG. 4 is a side cross-sectional view of the structure of FIG. 3 after an etch step has been performed so as to etch through the hard mask and the oxide layer and after remaining resist has been removed in accordance with one embodiment of the present invention.

FIGS. 2–4 illustrate the formation of a masking structure 7 that includes an oxide layer 3 and an overlying hard mask 4. First, an oxide layer 3 is grown or deposited on semiconductor substrate 2. In the present embodiment oxide layer 3 has a thickness of approximately 90 Angstroms and is formed immediately over the top surface of semiconductor substrate 2. Hard mask 4 is then formed such that it immediately overlies oxide layer 3. Hard mask 4 can be a silicon nitride ($Si_3N_4$) film that is formed by depositing silicon nitride in a furnace using a Low Pressure Chemical Vapor Deposition (LPCVD) process. In one embodiment hard mask 4 is a single layer of silicon nitride that has a thickness of from 1,000 to 1,500 Angstroms.

Referring now to FIGS. 2–3, hard mask 4 is patterned by depositing a photoresist layer 5 that is exposed and developed to form opening 12. Opening 12 defines isolation regions in semiconductor substrate 2 by extending around those portions of the substrate where isolation regions are to be formed. Hard mask 4 is patterned using an etch process that etches through both hard mask 4 and oxide layer 3. Photoresist layer 5 is then stripped, giving masking structure 7 that is shown in FIG. 4. Opening 13 which extends through both silicon nitride film 4 and oxide layer 3 exposes a portion of the top surface of semiconductor substrate 2.

Though masking structure 7 of the present invention is formed using a layer of silicon nitride hard mask, it is appreciated that other materials and processes could be used to form a masking structure that exposes portions of the semiconductor substrate 2 to define regions that are to be to etched to form shallow trench isolation structures. In one embodiment a masking structure is formed using one or more layers, with individual layers formed of silicon nitride, silicon oxynitride or any other material that can be used as an etch stop in a chemical-mechanical polishing process.

As shown by step 102 an etch is performed so as to form trenches within the semiconductor substrate. In the present embodiment a highly directional dry etch process is used that etches the semiconductor substrate vertically. In one embodiment etch 102 is a reactive ion etch that has a high selectivity between silicon and silicon nitride such that silicon substrate 2 is preferentially etched.

In one exemplary embodiment an etch chemistry is used that includes carbon tetraflouride ($CF_4$), hydrogen Bromide (HBr), Chlorine ($Cl_2$), helium (He), and oxygen ($O_2$). In this embodiment the reactive ion etch is performed at a pressure of from 50 to 70 milliTorr and at a power of from 600 to 800 Watts.

Figure 5:
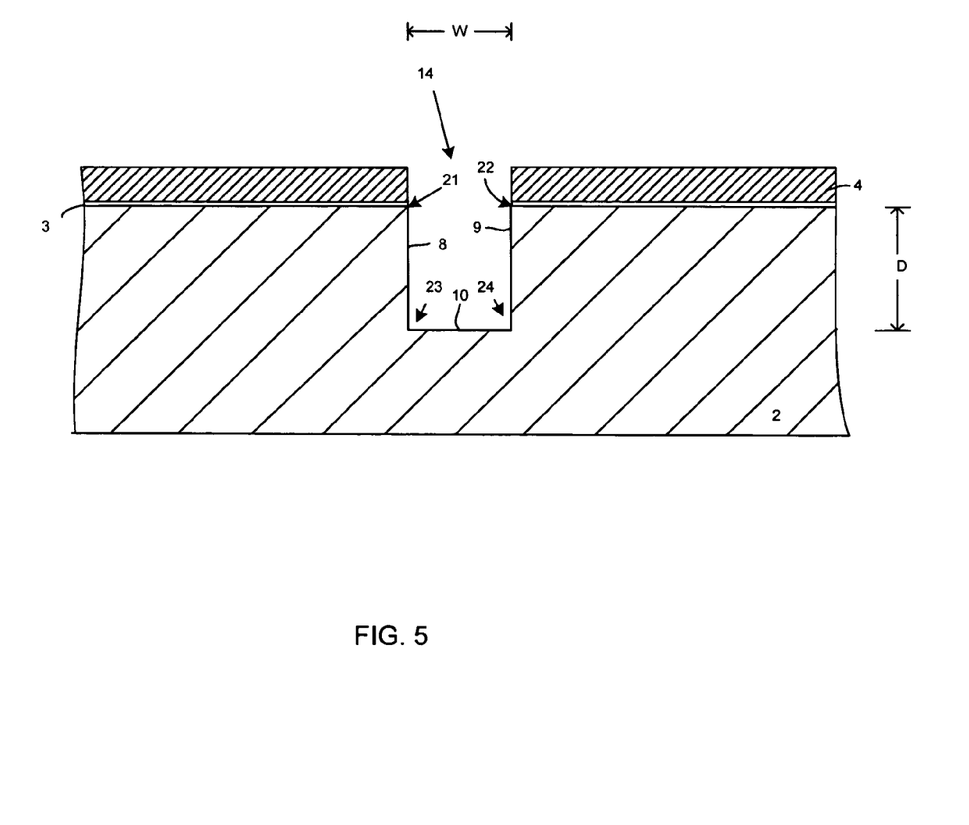
FIG. 5 is a side cross-sectional view of the structure of FIG. 4 after an etch step has been performed so as to form a trench that extends within the semiconductor substrate in accordance with one embodiment of the present invention.

FIG. 5 shows a trench 14 formed in accordance with method 100 that is bounded by side surface 8–9 and bottom surface 10 of semiconductor substrate 2. Side surfaces 8–9 extend on opposite sides of trench 14 and are approximately perpendicular to the top surface of semiconductor substrate 2. Side surfaces 8–9 intersect bottom surface 10 so as to form sharp corners 23–24. In addition, sharp corners 21–22 are formed where side surfaces 8–9 intersect the top surface of semiconductor substrate 2.

Etch step 102 forms a trenches having any desired width W and depth D. In one embodiment trenches are formed having a width W of from 1,500 to 2,500 Angstroms and a depth D of 1,000 Angstroms to 10,000 Angstroms. In the present embodiment trench 14 has a width W of approximately 2000 Angstroms and a depth D of 3,500 Angstroms.

Referring now to step 103 an anti-reflective film is deposited. In the present embodiment the anti-reflective film is one or more layer of oxynitride film. The characteristics of the deposited film are carefully tuned such that the anti-reflective layer has anti-reflective characteristics. In one embodiment an anti-reflective film is formed that will reflect light having a phase that is 180 degrees out of phase relative to phase of the incoming light. In one specific embodiment an oxynitride anti-reflective film is used that has a thickness of from 200 to 400 Angstroms, a refractory index (n) of from 1.5 to 2.5, and an extinction coefficient (k) of from 0.25 to 1.8.

Figure 6:
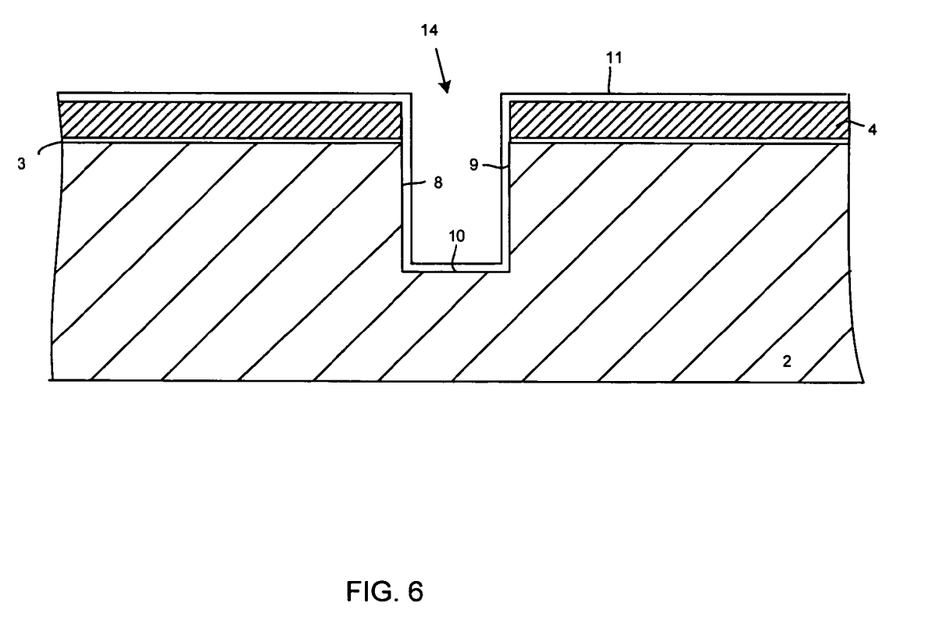
FIG. 6 is a side cross-sectional view of the structure of FIG. 5 after an anti-reflective film has been deposited thereover in accordance with one embodiment of the present invention.

In the embodiment shown in FIG. 6 an anti-reflective film 11 is shown to be deposited over semiconductor substrate 2 such that it directly and immediately overlies surfaces 8–10 so as to line trench 14. Moreover, a portion of anti-reflective film 11 extends over the top surface of semiconductor substrate 2, immediately overlying hard mask 4.

As shown by step 104 a dielectric film is deposited that fills the trench. In one embodiment the dielectric film is single layer of dielectric film. The dielectric film can be a High Density Plasma (HDP) oxide that is deposited using a Plasma Enhanced Chemical Vapor Deposition (PECVD) process. In another embodiment the dielectric film is ozone Tetraethyl Orthosilicate (TEOS), that can also be referred to as Undoped Silicate Glass (USG), or Non-doped Silicate Glass (NSG). In another embodiment the dielectric film is spin-on dielectric such as Spin-On-Glass (SOG). However, dielectric film 13 can also be formed using multiple layers of material and can be formed using any of a number of other materials that have good dielectric properties.

Figure 7:
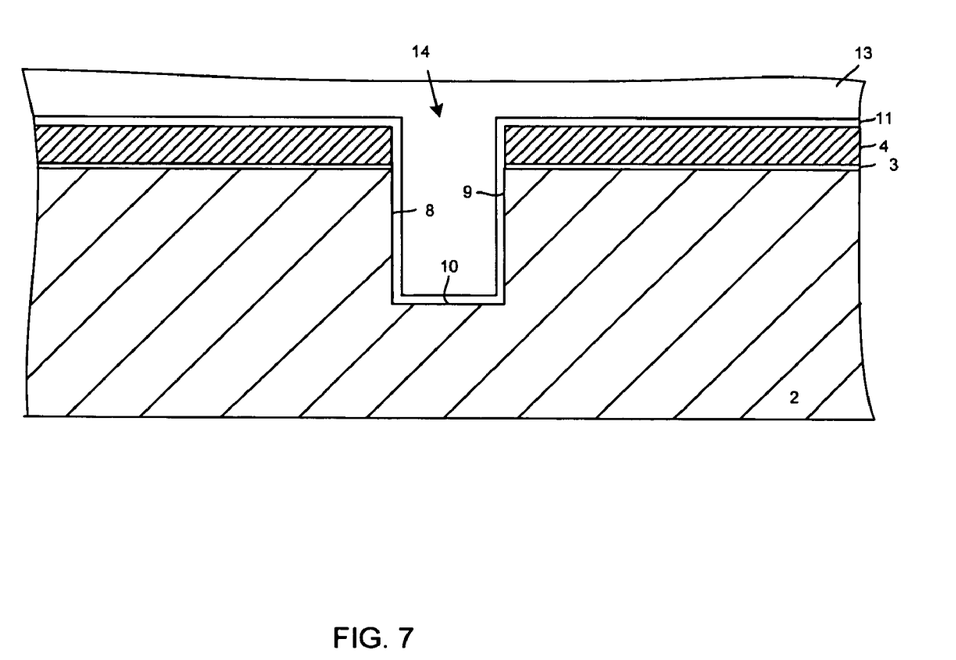
FIG. 7 is a side cross-sectional view of the structure of FIG. 6 after a dielectric film has been deposited thereover in accordance with one embodiment of the present invention.

In the embodiment shown in FIG. 7 a dielectric film 13 is shown to be deposited such that dielectric film 13 immediately overlies anti-reflective film 11. Dielectric film 13 fills trench 14, with a portion of dielectric film 13 extending over the top surface of substrate 2 and over hard mask 4.

Figure 8:
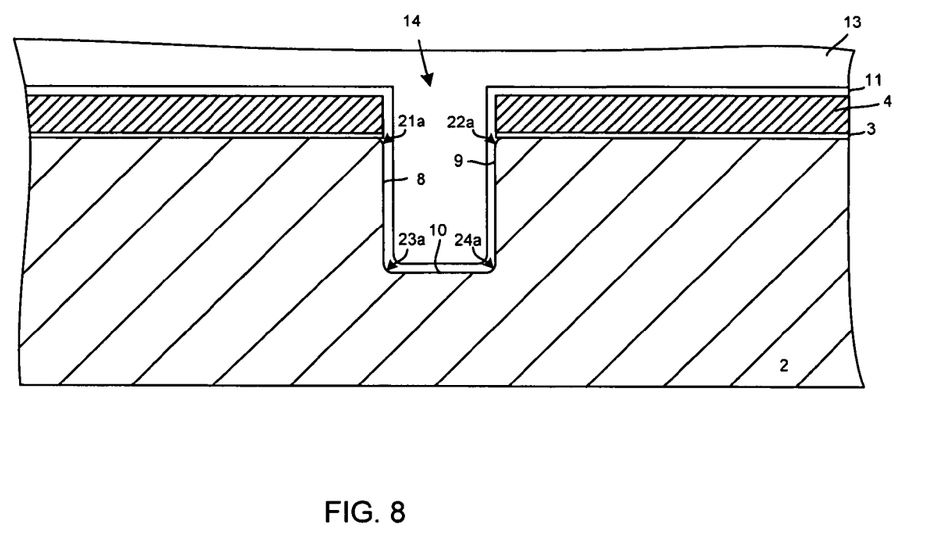
FIG. 8 is a side cross-sectional view of the structure of FIG. 7 after a heating process has been performed so as to round the corners of the trench in accordance with one embodiment of the present invention.

As shown by step 105 the substrate is heated. In the present embodiment the structure shown in FIG. 7 is heated in an oven to a temperature of between 750 degrees Centigrade and 1,000 degrees Centigrade so as to thermally anneal the semiconductor substrate. This rounds corners 21–24 so as to form rounded corners 21a–24a. More particularly, the corner 21 between side surface 8 and the top surface of semiconductor substrate 2 is rounded so as to form rounded corner 21a; the corner 22 between side surface 9 and the top surface of semiconductor substrate 2 is rounded so as to form rounded corner 22a. Also, corner 23 between side surface 8 and bottom surface 10 is rounded to form rounded corner 23a; and corner 24 between bottom surface 10 and side surface 9 is rounded to form rounded corner 24a. Moreover, heating step 105 anneals substrate 2, repairing the damage to surfaces 8–10 caused by trench etch step 102. In addition heating step 105 densifies silicon oxynitride anti-reflective film 11 and dielectric film 13.

In one embodiment the anneal process of step 105 is a furnace anneal, performed at a temperature of between 750 degrees Centigrade and 1,000 degrees Centigrade, in a dry nitrogen ambient. Alternatively, a wet anneal processes is used such as a steam anneal in which the substrate is heated, at a temperature of between 750 degrees Centigrade and 1,000 degrees Centigrade, in a steam ambient. In yet another embodiment a Rapid Thermal Anneal (RTA) process is used in which the substrate is heated to a temperature of between 750 degrees Centigrade and 1,000 degrees Centigrade for a short period of time.

Figure 9:
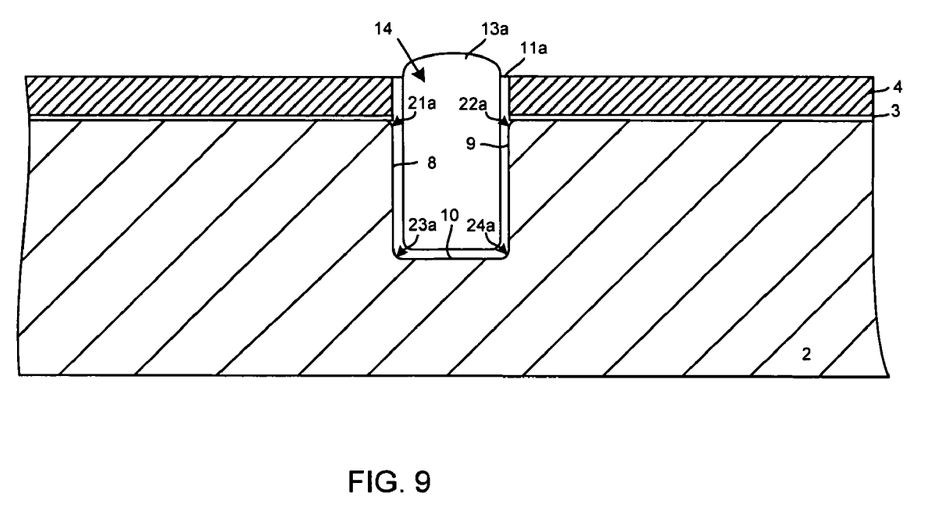
FIG. 9 is a side cross-sectional view of the structure of FIG. 8 after a chemical mechanical polishing process has been performed in accordance with one embodiment of the present invention.

As shown by step 106 a chemical-mechanical polishing process is performed. In the present embodiment, the chemical-mechanical polishing process removes those portions of dielectric film 13 and anti-reflective film 11 that overlie hard mask 4 so as to form dielectric plug 13a and anti-reflective liner 11a. In the present embodiment hard mask 4 is used as an etch stop for the chemical-mechanical polishing process, planarizing the top surface such that the top surface of plug 13a is approximately coplanar with the top surface of hard mask 4.

As shown by step 107 the remaining hard mask is removed. In one embodiment a HF clean process is performed immediately prior to removal of the hard mask to clean the surface of the hard mask. When hard mask 4 is a silicon nitride film it can be removed using a hot phosphoric acid ($H_3PO_4$) strip. Alternatively, other processes can be used to remove hard mask 4 such as, for example dry etch processes or other wet etch processes, depending on the material that is used to form hard mask 4.

Figure 10:
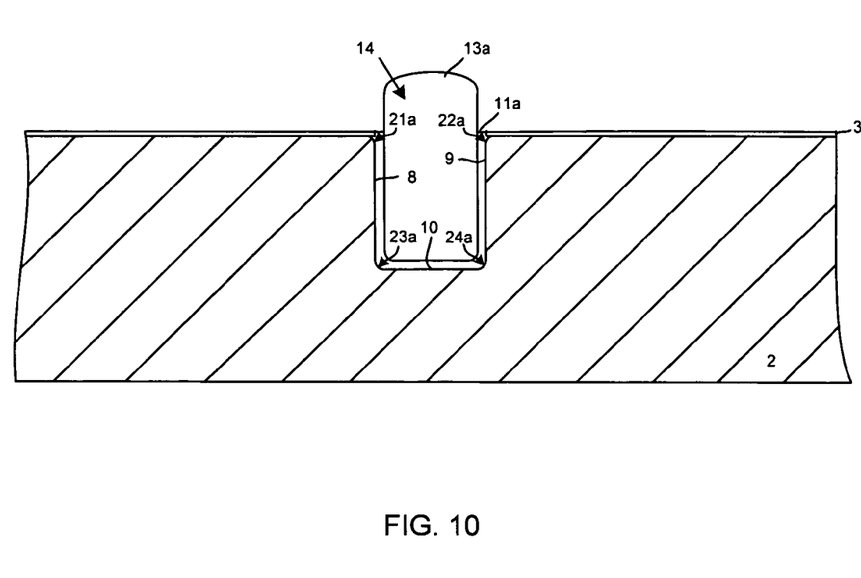
FIG. 10 is a side cross-sectional view of the structure of FIG. 9 after the remaining hard mask has been removed in accordance with one embodiment of the present invention.

FIG. 10 shows the structure of FIG. 9 after hard mask 4 has been removed. The resulting shallow trench isolation structure that is shown in FIG. 10 has reduced stress-related defects as compared to prior art trenches having sharp corners. More particularly, because the corners of bottom surfaces 21a–24a are rounded, semiconductor substrate 2 has reduced stress-related defects and reduced electrical-field-buildup-related problems as compared to prior art shallow trench isolation structures that include trenches having sharp corners. Moreover, method 100 of the present invention does not require the formation of an oxide liner using a conventional high-temperature oxidation process, avoiding the severe stress buildup problems that can result from the higher temperatures of prior art processes that form oxide liners using conventional high-temperature oxidation processes. Moreover, since heating step 105 is performed at a temperature that is lower than the temperature of prior art process that form oxide liners using conventional high-temperature oxidation processes less stress buildup occurs as compared to prior art processes. Accordingly, manufacturing yield is improved, resulting in reduced manufacturing cost.

Figure 11:
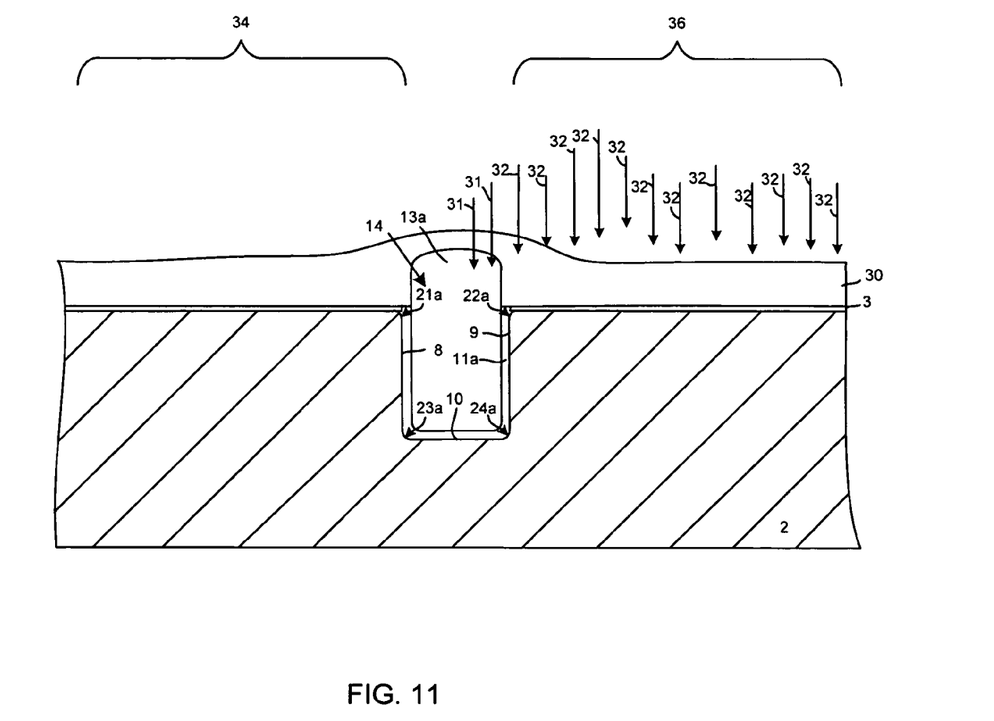
FIG. 11 is a side cross-sectional view of the structure of FIG. 10 after a layer of photoresist has been deposited thereover, and illustrates an exposure process in which some light passes into the shallow trench isolation structure in accordance with one embodiment of the present invention.
Figure 12:
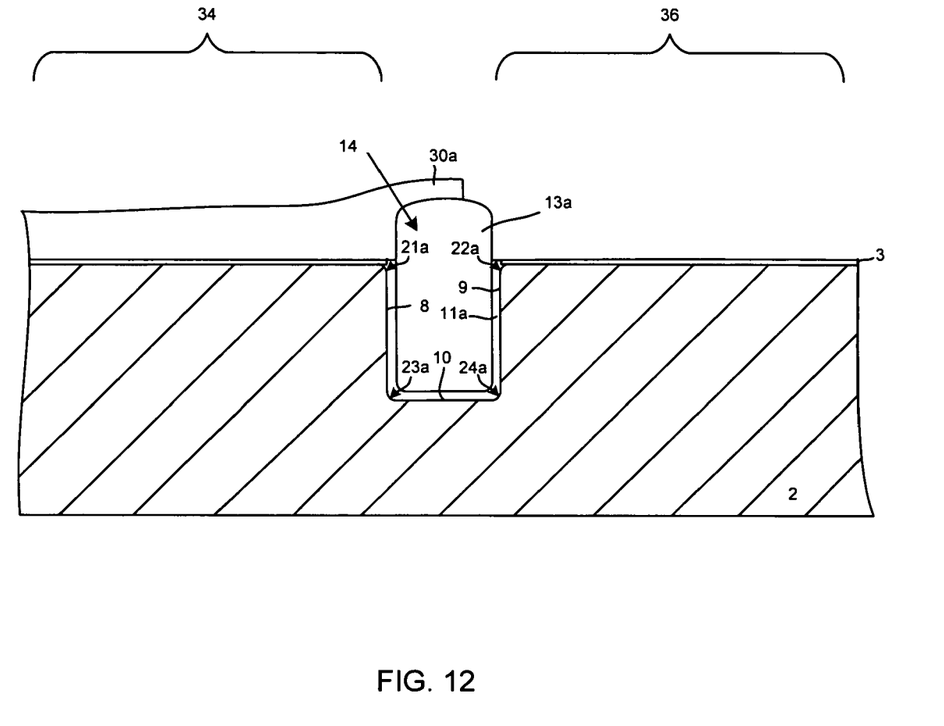
FIG. 12 is a side cross-sectional view of the structure of FIG. 11 after a photoresist development process has been performed so as to form a patterned photoresist layer that covers all of region 34 and that exposes all of region 36 in accordance with one embodiment of the present invention.

FIGS. 11–12 illustrate a subsequent implantation process in which species are to be implanted into region 36 and in which no species are to be implanted into region 34. First, photoresist layer 30 is deposited such that is extends over all of semiconductor substrate 2. Light is passed through a photomask so as to cause deprotection of portions of photoresist layer 30 where light strikes photoresist layer 30 as illustrated by arrows 31–32 of FIG. 11. Light that passes through photoresist layer 30 and into trench 14, illustrated by arrows 31 has a phase change of 180 degrees as it passes through anti-reflective liner 11a, causing cancellation of reflected light at regions of photoresist 30 where notching and lifting would otherwise occur. Accordingly, after development of photoresist 30 to form patterned photoresist layer 30a, notching and lifting problems are prevented that can result from reflection of light off of the sides of trenches, giving a patterned photoresist layer 30a that completely covers region 34 and that does not cover any of region 36. Thus, during the subsequent implantation of region 36, all of region 36 is implanted and no portion of region 34 is implanted, giving the desired implantation of substrate 2. Accordingly, the use of antireflective liner 11a eliminates notching and lifting problems that can result from reflection of light off of side surfaces 8–9 and bottom surface 10 of trench 14. Accordingly, manufacturing yield is improved, resulting in reduced manufacturing cost.

The preferred embodiment of the present invention is thus described. While the present invention has been described in particular embodiments, it should be appreciated that the present invention should not be construed as limited by such embodiments, but rather construed according to the following claims.

What is claimed is:

1. A method for forming a shallow trench isolation structure comprising:
forming a trench within a semiconductor substrate, said trench having a bottom surface and having side surfaces that extend on each side of said bottom surface;
depositing an anti-reflective film within said trench such that said anti-reflective film overlies said bottom surface and said side surfaces of said trench, a portion of said anti-reflective film overlying a hard mask that extends over said semiconductor substrate;
depositing a dielectric film over said anti-reflective film;
heating said semiconductor substrate so as to round corners of said trench; and
removing that portion of said anti-reflective film and said dielectric film that overlie said hard mask so as to form an anti-reflective liner that extends within said trench and form a dielectric plug that is disposed within said anti-reflective liner.

2. A method as recited in claim 1 wherein said anti-reflective film comprises oxynitride.

3. A method as recited in claim 2 wherein said heating said semiconductor substrate further comprises heating said semiconductor substrate to a temperature of between 750 degrees Centigrade and 1,000 degrees Centigrade.

4. A method as recited in claim 2 wherein said anti-reflective film has a thickness of from 200 to 400 Angstroms.

5. A method as recited in claim 2 wherein said anti-reflective film has a refractory index (n) of from 1.5 to 2.5, and an extinction coefficient (k) of from 0.25 to 1.8.

6. A method as recited in claim 1 wherein said dielectric film is selected from the group consisting of HDP oxide, ozone TEOS and spin-on dielectric.

7. A method as recited in claim 1 wherein said anti-reflective film reflects light at a phase that is 180 degrees out of phase.

8. A method as recited in claim 1 wherein said removing that portion of said anti-reflective film and said dielectric film that overlie said hard mask further comprises performing a chemical-mechanical polishing process.

9. A method for forming a shallow trench isolation structure comprising:
forming an oxide layer on a semiconductor substrate;
depositing a hard mask over said oxide layer such that said hard mask immediately overlies said oxide layer;
patterning said hard mask so as to form an opening that extends through said hard mask;
performing an etch process so as to form a trench within said semiconductor substrate, said trench having a bottom surface and having side surfaces that extend on each side of said bottom surface;
depositing an oxynitride anti-reflective film such that said oxynitride anti-reflective film immediately overlies said bottom surface and said side surfaces of said trench, a portion of said oxynitride anti-reflective film overlying said hard mask;
depositing a dielectric film so as to fill said trench, a portion of said dielectric film overlying said hard mask;
heating said semiconductor substrate so as to round corners of said trench; and
removing those portions of said layer of oxynitride anti-reflective film and said dielectric film that overlie said hard mask so as to form an oxynitride anti-reflective liner that extends within said trench and a dielectric plug that extends within said oxynitride anti-reflective liner.

10. A method as recited in claim 9 wherein said anti-reflective film has a refractory index (n) of from 1.5 to 2.5, and an extinction coefficient (k) of from 0.25 to 1.8.

* * * * *